(12) United States Patent
Yazaki

(10) Patent No.: US 8,988,167 B2
(45) Date of Patent: Mar. 24, 2015

(54) RF SIGNAL BLOCKING DEVICE

(71) Applicant: Murata Manufacturing Co., Ltd., Nagaokakyo-shi, Kyoto-fu (JP)

(72) Inventor: Hirokazu Yazaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/222,848

(22) Filed: Mar. 24, 2014

(65) Prior Publication Data

US 2014/0203891 A1    Jul. 24, 2014

Related U.S. Application Data

(63) Continuation of application No. PCT/JP2013/050073, filed on Jan. 8, 2013.

(30) Foreign Application Priority Data

Jan. 16, 2012   (JP) ................. 2012-005852

(51) Int. Cl.
| | | |
|---|---|---|
| H03H 7/01 | (2006.01) | |
| H01P 7/00 | (2006.01) | |
| H01H 85/02 | (2006.01) | |
| H01H 85/046 | (2006.01) | |
| H01F 17/00 | (2006.01) | |
| H03H 1/00 | (2006.01) | |
| H01P 1/00 | (2006.01) | |
| H01P 1/12 | (2006.01) | |
| H01P 1/203 | (2006.01) | |

(52) U.S. Cl.
CPC ........... H03H 7/0115 (2013.01); H01H 85/046 (2013.01); H01F 17/0013 (2013.01); *H03H 2001/0085* (2013.01); *H01P 1/00* (2013.01); *H01H 2085/0275* (2013.01); *H01P 1/127* (2013.01); *H01P 1/20345* (2013.01); *H01F 2017/0026* (2013.01)
USPC ............ 333/176; 333/185; 333/219; 361/626

(58) Field of Classification Search
CPC ................... H03H 7/0115; H03H 2001/0085; H01H 85/046; H01H 2085/0275; H01F 17/00; H01P 1/127
USPC ................... 333/176, 185, 246, 219; 361/626
See application file for complete search history.

(56) References Cited

FOREIGN PATENT DOCUMENTS

| | | |
|---|---|---|
| JP | 63-20213 U | 2/1988 |
| JP | 01-287905 A | 11/1989 |
| JP | 06-233452 A | 8/1994 |
| JP | 09-330824 A | 12/1997 |
| JP | 2001-175895 A | 6/2001 |

OTHER PUBLICATIONS

Official Communication issued in International Patent Application No. PCT/JP2013/050073, mailed on Apr. 16, 2013.

*Primary Examiner* — Benny Lee
*Assistant Examiner* — Rakesh Patel
(74) *Attorney, Agent, or Firm* — Keating & Bennett, LLP

(57) ABSTRACT

An RF signal blocking device includes a capacitor unit and an inductor unit defining an LC resonance circuit. The capacitor unit and inductor unit are set such that a cutoff frequency in the LC resonance circuit after disconnection by fusing of a second inductor including a fuse wire, among first and second inductors of the inductor unit, fluctuates within a prescribed frequency band. The RF signal blocking device reliably blocks an RF signal in a prescribed frequency band after an abnormality of fusing in the second inductor including a fuse wire occurs due to an input of an RF signal having an RF power value greater than or equal to a predetermined level.

16 Claims, 4 Drawing Sheets

RF SIGNAL BLOCKING DEVICE

BACKGROUND OF THE INVENTION

1. Field of the Invention

The present invention relates to an RF signal blocking device having a function of blocking an RF signal in a prescribed frequency band after an RF signal having an RF power value greater than or equal to a predetermined level is inputted.

2. Description of the Related Art

As illustrated in one example of a coil with a fuse function shown in FIG. 7, a coil 500 with a fuse function has been known which is configured such that a solenoid coil 503 is enclosed in a cylindrical glass tube 505 provided with conductive caps 504 at opposite ends. See, for example, Japanese Patent Laying-Open No. 9-330824. The solenoid coil 503 is including a fuse line 502 wound around an outer peripheral surface of a cylindrical ferrite core 501. Coil 500 with a fuse function has both a normal fuse function for protection from a short circuit current and an overload and a coil function which is useful for suppression of an inrush current and noise reduction, thus one element can achieve two functions. Therefore, a space for disposing coil 500 with a fuse function is reduced, so that high-density packaging of electronic equipment can be readily performed, enabling miniaturization of a device.

In recent years, communication mobile terminals such as mobile phones and mobile information terminals with a higher frequency have been developed. In a case where coil 500 with a fuse function described above is used for communication mobile terminals with higher frequency, the following problem may arise. In other words, even in a case where fuse line 502 is fused due to a flow of an overcurrent to coil 500 with a fuse function, when a high-frequency signal (RF signal) is provided, the fused portion of fuse line 502 may possibly be coupled by capacitive coupling, magnetic field coupling, or both to thereby transmit an RF signal through the fused portion of fuse line 502.

SUMMARY OF THE INVENTION

In view of the problems described above, preferred embodiments of the present invention provide an RF signal blocking device with a new configuration having a function capable of reliably blocking an RF signal in a prescribed frequency band after an RF signal having an RF power value greater than or equal to a predetermined level is inputted.

An RF signal blocking device according to a preferred embodiment of the present invention is an RF signal blocking device having a function of blocking an RF signal in a prescribed frequency band after an RF signal having an RF power value greater than or equal to a predetermined level is inputted, and the signal blocking device includes an LC resonance circuit including a capacitor unit that includes at least one capacitor and an inductor unit that includes a first inductor and a second inductor connected in parallel, and having a resonant frequency higher than the prescribed frequency band. The second inductor includes a fuse wire which is fused due to an input of an RF signal having an RF power value greater than or equal to the predetermined level, and a resonant frequency of the LC resonance circuit after fusing of the second inductor is set in the prescribed frequency band.

According to a preferred embodiment of the present invention configured as described above, an LC resonant circuit including a capacitor unit that includes at least one capacitor and an inductor unit that includes a first inductor and a second inductor connected in parallel and having a resonant frequency higher than a prescribed frequency band allows a signal in a prescribed frequency band to pass through in a normal time. On the other hand, the second inductor of the inductor unit includes a fuse wire which is fused due to an input of an RF signal having an RF power value greater than or equal to a predetermined level, thus the second inductor including a fuse wire is fused when an RF signal having an RF power value greater than or equal to the predetermined level is inputted.

Since the inductor unit is defined by connecting the first inductor and the second inductor in parallel, inductance (L) of this parallel circuit is relatively small. However, when the second inductor including a fuse wire is disconnected by fusing, the number of inductors connected in parallel is reduced, so that inductance (L) of the inductor unit increases. Thus, since a resonant frequency f (cutoff frequency) of the LC resonance circuit is determined by $$f=1/(2\pi(LC)^{1/2})$$

based on capacitance (C) of the capacitor unit and inductance of the inductor unit, an increase in the inductance causes the resonant frequency in the LC resonance circuit to fluctuate to be low, so that an RF signal with the fluctuated resonant frequency is blocked.

Thus, by setting the capacitor unit and the inductor unit such that the resonant frequency in the LC resonance circuit after the disconnection of the second inductor including a fuse wire by fusing fluctuates within the prescribed frequency band, an RF signal blocking device is provided which involves a new configuration having a function capable of reliably blocking an RF signal in a prescribed frequency band after an abnormality of fusing in the second inductor including a fuse wire occurs due to an input of an RF signal having an RF power value greater than or equal to a predetermined level.

Further, it is preferable that a magnetic body arranged close to the fuse wire is further included.

With such a configuration, since a magnetic body exhibits a large loss in a high-frequency band, and an RF signal inputted to a fuse wire is lost as heat by the magnetic body, the magnetic body arranged close to the fuse wire generates heat to effectively heat the fuse wire in the case where an RF signal having an RF power value greater than or equal to a predetermined level is inputted to the fuse wire, so that the fuse wire is fused efficiently. Further, it is more preferable that the fuse wire is provided at the magnetic body.

Further, it is preferable that the capacitor unit and the inductor unit constitute a parallel circuit, and an input terminal connected to one connection point of the parallel circuit and an output terminal connected to the other connection point are provided.

With such a configuration, the LC resonance circuit including the capacitor unit and the inductor unit connected in parallel has a characteristic that impedance becomes maximum at the resonant frequency. By connecting the input terminal to one connection point of the parallel circuit including the capacitor unit and the inductor unit connected in parallel and connecting the output terminal to the other connection point, the second inductor including the fuse wire is disconnected by fusing when an RF signal having an RF power value greater than or equal to a predetermined level is inputted to the LC resonance circuit, and the resonant frequency of the LC resonance circuit fluctuates within the prescribed frequency band. After that, the RF signal in the prescribed frequency band inputted to the input terminal is reflected by the LC resonance circuit, and therefore, the RF signal in the prescribed frequency band is reliably blocked.

Further, it may also be preferable that the capacitor unit and the inductor unit constitute a series circuit, and an input terminal and an output terminal connected to one open end of the series circuit are provided, and the other open end is grounded.

With such a configuration, the LC resonance circuit including the capacitor unit and the inductor unit connected in series has a characteristic such that impedance becomes minimum at the resonant frequency. By connecting the input terminal and the output terminal to one open end of the series circuit including the capacitor unit and the inductor unit connected in series and grounding the other connection point, the second inductor including a fuse wire is disconnected by fusing when the RF signal having an RF power value greater than or equal to the predetermined level is inputted to the LC resonance circuit, and the resonance frequency of the LC resonance circuit fluctuates within the prescribed frequency band. After that, the RF signal in the prescribed frequency band inputted to the input terminal flows to the ground through the LC resonance circuit, and therefore, the RF signal in the prescribed frequency band is reliably blocked.

Further, it is preferable that the LC resonance circuit is included in a chip component.

With such a configuration, the LC resonance circuit preferably is formed integrally to be a single chip component, so that the RF signal blocking device is compact. Therefore, the RF signal blocking device is easily and readily mountable to a wiring substrate or the like.

According to various preferred embodiments of the present invention, the capacitor unit and the inductor unit of the LC resonance circuit are configured such that the resonant frequency of the LC resonance circuit after disconnection by fusing of the second inductor including the fuse wire, among the first and second inductors of the inductor unit, fluctuates within the prescribed frequency band. Accordingly, an RF signal blocking device is provided which involves a new configuration having a function capable of reliably blocking an RF signal in a prescribed frequency band after an abnormality of fusing in the second inductor including a fuse wire occurs due to an input of an RF signal having an RF power value greater than or equal to a predetermined level.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A and 3B are explanatory diagrams of the RF signal blocking device shown in FIG. 1, wherein FIG. 3A illustrates an equivalent circuit, and FIG. 3B illustrates a frequency characteristic.

FIGS. 4A and 4B are explanatory diagrams illustrating a different state of the RF signal blocking device shown in FIG. 1, wherein FIG. 4A illustrates an equivalent circuit, and FIG. 4B illustrates a frequency characteristic.

FIGS. 5A and 5B are explanatory diagrams illustrating an RF signal blocking device according to a second preferred embodiment of the present invention, wherein FIG. 5A illustrates an equivalent circuit, and FIG. 5B illustrates a frequency characteristic.

FIGS. 6A and 6B are explanatory diagrams representing a different state of the RF signal blocking device shown in FIGS. 5A and 5B, wherein FIG. 6A illustrates an equivalent circuit, and FIG. 6B illustrates a frequency characteristic.

DETAILED DESCRIPTION OF THE PREFERRED EMBODIMENTS

First Preferred Embodiment

Figure 1:
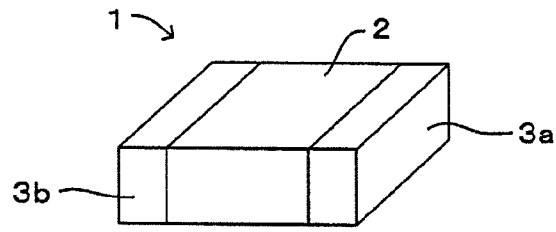
FIG. 1 illustrates an RF signal blocking device according to a first preferred embodiment of the present invention.
Figure 2:
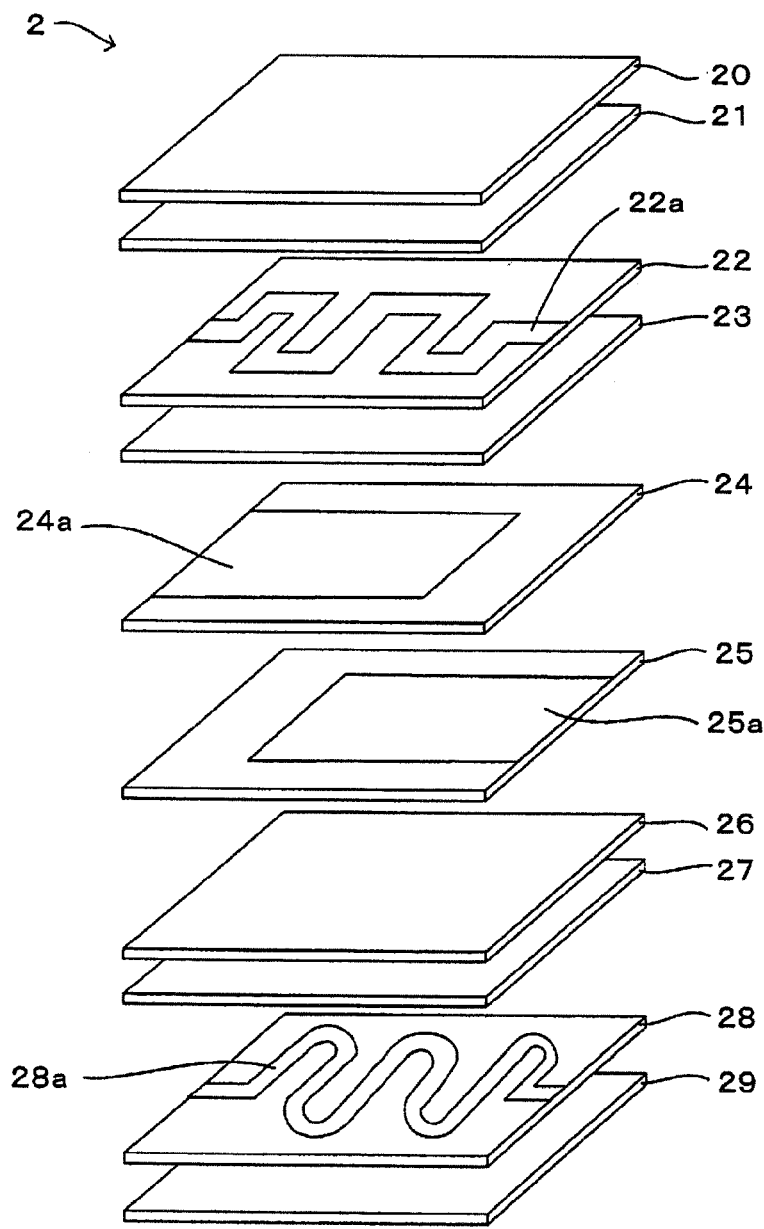
FIG. 2 illustrates an internal configuration of the RF signal blocking device shown in FIG. 1.
Figure 3A:
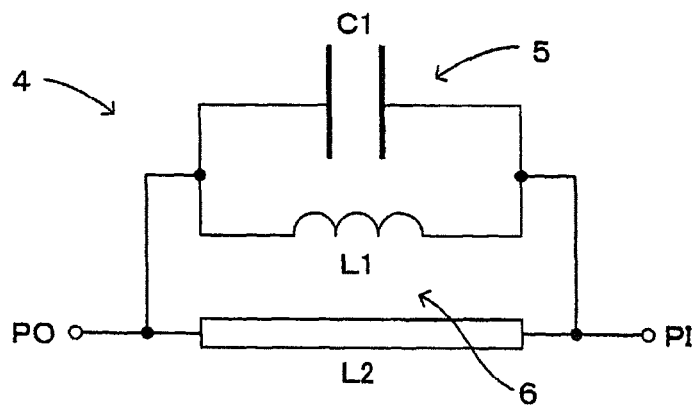
Figure 3B:
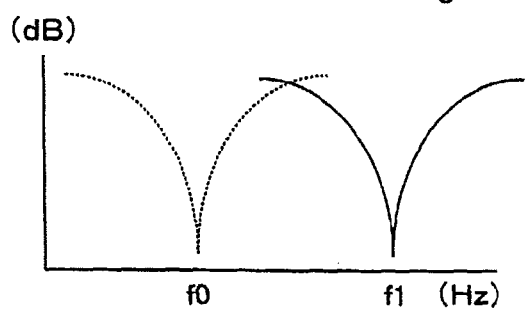
Figure 4A:
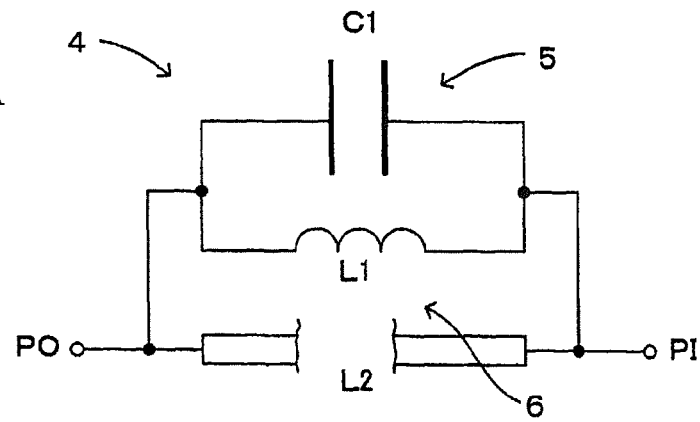
Figure 4B:
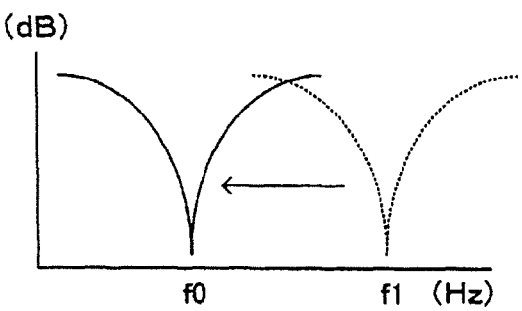

A first preferred embodiment of an RF signal blocking device of the present invention will be described with reference to FIGS. 1 to 4. FIG. 1 represents an RF signal blocking device according to the first preferred embodiment of the present invention. FIG. 2 represents an internal configuration of the RF signal blocking device shown in FIG. 1. FIGS. 3A, 3B, 4A and 4B are explanatory diagrams representing functions of the RF signal blocking device according to FIG. 1, where FIGS. 3A and 4A represent an equivalent circuit, and FIGS. 3B and 4B represent a frequency characteristic. For simplification of description, FIGS. 1 to 4B show only a basic configuration according to a preferred embodiment of the present invention, and other configuration details are not illustrated. Further, FIGS. 3A and 3B represent the RF signal blocking device in a normal state, and FIGS. 4A and 4B represent a state where an abnormality has occurred in the RF signal blocking device.

As shown in FIG. 1, an RF signal blocking device 1 preferably is configured as a chip component and provided therein with an LC resonance circuit 4 shown in FIG. 3A, and includes a multilayer substrate 2, which is preferably formed by baking a laminate constituted of dielectric ceramic layers and a magnetic ceramic layer, and external electrodes 3a, 3b located at opposite ends of multilayer substrate 2. RF signal blocking device 1 blocks an RF signal in a prescribed frequency band after an RF signal having an RF power value greater than or equal to a predetermined level is inputted. Further, external electrodes 3a, 3b are respectively provided as an input terminal PI and an output terminal PO of LC resonance circuit 4.

Multilayer substrate 2 is constituted by a lamination of insulator layers 20 to 27, and 29 and a magnetic layer 28. A first inductor 22a (inductor L1) is provided on insulator layer 22, and a second inductor 28a (inductor L2) is provided on magnetic layer 28. A first capacitor electrode 24a and a second capacitor electrode 25a are respectively provided on insulator layers 24, 25. A capacitor unit 5 (capacitor C1) includes first capacitor electrode 24a, insulator layer 24, and second capacitor electrode 25a. In the present preferred embodiment, insulator layers 20 to 27, and 29 preferably are constituted by alumina-based glass ceramic, and magnetic layer 28 is constituted by magnetic ceramic containing ferrite as a main component.

Specifically, insulator layer 22 is provided with a meander-shaped first inductor 22a defining inductor L1. One end of first inductor 22a is connected to external electrode 3a (input terminal PI), and the other end is connected to external electrode 3b (output terminal PO).

Insulator layer 24 is provided with first capacitor electrode 24a defining one electrode of capacitor C1 and is connected to external electrode 3b (output terminal PO). Further, insulator layer 25 is provided with second capacitor electrode 25a defining the other electrode of capacitor C1 and is connected to external electrode 3a (input terminal PI).

Magnetic layer 28 is provided with second inductor 28a defining a coil L2. Second inductor 28a includes a fuse wire having a thickness and a length configured to fuse due to an input of an RF signal having an RF power value greater than or equal to a predetermined level. One end of second inductor 28a is connected to external electrode 3a (input terminal PI), and the other end is connected to external electrode 3b (output terminal PO). The term "fuse" indicates that a wiring pattern including a fuse wire constituting second inductor 28a is melted by heat and disconnected, for example.

Next, one example of a method for manufacturing RF signal blocking device 1 shown in FIG. 1 will be described schematically. RF signal blocking device 1 of the present preferred embodiment is manufactured preferably by firstly forming multilayer substrate 2 having ceramic as a base material by baking and thereafter forming external electrodes 3a, 3b at opposite ends of the formed multilayer substrate 2.

A ceramic green sheet defining each of the layers 20 to 29 constituting multilayer substrate 2 is obtained by using a film forming device to form a sheet of slurry of mixed powders including alumina and glass mixed together with an organic binder and solvent, and is configured so that baking at a temperature lower than about 1000° C. can be applied, in other words, low-temperature baking can be applied, for example.

Specifically, insulator ceramic green sheets constituting insulator layers 20-27 and 29 are prepared preferably by using a sheet forming machine to form a sheet of ceramic slurry made of mixed powders of alumina and glass, an organic binder, a solvent, and the like. Further, a magnetic ceramic green sheet constituting magnetic layer 28 is prepared by using a sheet forming machine to form a sheet of ceramic slurry made of ferrite material powders, an organic binder, a solvent, and the like.

Next, a conductor paste containing conductive powders of Ag, Cu, and the like is used to form inductor patterns (first inductor 22a, second inductor 28a) and capacitor electrode patterns (first capacitor electrode 24a, second capacitor electrode 25a) so as to be arranged vertically and horizontally in plural on one ceramic green sheet by screen printing or the like. In other words, first inductor pattern 22a is formed on insulator ceramic green sheet 22, and second inductor pattern 28a is formed on magnetic ceramic green sheet 28. Further, first capacitor electrode 24a is formed on insulator ceramic green sheet 24, and second capacitor electrode 25a is formed on insulator ceramic green sheet 25. It should be noted that an insulator ceramic green sheet forming insulator layer 27 laminated on magnetic layer 28 and arranged close to second inductor 28a (inductor L2) may be formed as a magnetic layer with the use of a magnetic ceramic green sheet.

Then, the insulator ceramic green sheets and the magnetic ceramic green sheet are laminated and crimped to fabricate a mother laminate. Subsequently, the mother laminate is press-cut by a cutting blade or cut by a dicer to be divided into substrates (multilayer substrate 2).

Next, the insulator ceramic green sheets, the magnetic ceramic green sheet, the inductor patterns, and the capacitor electrode patterns are baked integrally to form multilayer substrate 2. Then, a conductive paste is applied on a surface of multilayer substrate 2, and a plating process is applied on the surface to form external electrodes 3a, 3b, so that production of RF signal blocking device 1 is completed.

It should be noted that external electrodes 3a, 3b may be formed by dividing a via conductor, which is formed so as to extend across division lines dividing the substrates, from the mother laminate. The via conductor is formed by forming a via hole at a predetermined position on the ceramic green sheet preferably using a laser and thereafter supplying a conductive paste so as to cover an inner surface of the via hole or fill the inner portion.

Further, the division into the substrates may be performed after baking the mother laminate. In the case of mounting a mounted portion on multilayer substrate 2, post-baking division capable of performing division after mounting the mounted portion is preferable to improve the handling ability at the time of mounting.

As shown in FIGS. 3A and 3B, in the present preferred embodiment, a parallel circuit is provided in which capacitor unit 5 constituted of capacitor C1 is connected in parallel with inductor unit 6 constituted of two inductors L1, L2 connected in parallel. Input terminal PI (external electrode 3a) is connected to one connection point of the parallel circuit having capacitor unit 5 and inductor unit 6 connected in parallel, and output terminal PO (external electrode 3b) is connected to the other connection point, so that LC resonance circuit 4 is formed which blocks an RF signal in a frequency band f1 higher than a prescribed frequency band f0.

Next, a frequency characteristic of RF signal blocking device 1 will be described. A resonant frequency f of LC resonance circuit 4 can be expressed as follows.

$$f=1/(2\pi(L \cdot C)^{1/2})$$

L: inductance
C: capacitance

Therefore, resonant frequency f of LC resonance circuit 4 becomes smaller as inductance L or capacitance C increases.

However, as shown in FIG. 4A, when an RF signal having an RF power value greater than or equal to a predetermined level is inputted from input terminal PI, second inductor 28a including a fuse wire, among inductors L1, L2 connected in series to define inductor unit 6, is fused and disconnected, so that inductance L of inductor unit 6 increases.

Thus, as described above, since resonance frequency f of LC resonance circuit 4 fluctuates to be lower when inductance L increases, the frequency characteristic of RF signal blocking device 1 fluctuates so as to block an RF signal in a prescribed frequency band as shown in FIG. 4B. In the present preferred embodiment, capacitor unit 5 and inductor unit 6 are set such that the resonance frequency of LC resonance circuit 4 constituted by capacitor C1 and inductor L1 becomes f0.

In an output circuit of mobile communication terminals such as mobile phones or mobile information terminals, RF signal blocking device 1 is inserted between a coupler connected to an antenna and an output of a power amplifier that amplifies the RF signal. Frequency band f0 at which an RF signal is blocked in the case where an RF signal having an RF power value greater than or equal to a predetermined level is set to the same frequency band of a transmission signal of communication mobile terminals. With such a configuration, when an RF signal having an RF power value greater than or equal to a predetermined level is outputted from the power amplifier, second inductor 28a of inductor L2 is fused and disconnected, so that the frequency band of a cutoff frequency of LC resonance circuit 4 fluctuates to f0. Accordingly, the RF signal in frequency band f0 outputted from the power amplifier is blocked after the frequency band of the cutoff frequency fluctuates, and therefore, damage to a coupler and an antenna due to the RF signal in frequency band f0 having an RF power value greater than or equal to the predetermined level outputted from the power amplifier is prevented.

As described above, according to the present preferred embodiment, LC resonance circuit 4 including capacitor unit 5 provided with capacitor C1 and inductor unit 6 including two inductors L1, L2 connected in parallel, and blocking an RF signal in frequency band f1 higher than prescribed frequency band f0 allows a signal in prescribed frequency band f0 to pass through in a normal time. On the other hand, second inductor 28a of inductor L2 of inductor unit 6 includes a fuse wire which is fused due to an input of an RF signal having an RF power value greater than or equal to a predetermined level, thus second inductor 28a (inductor L2) including a fuse wire is fused when an RF signal having an RF power value greater than or equal to a predetermined level is inputted to LC resonance circuit 4.

Since inductor unit 6 is formed preferably by connecting two inductors L1, L2 in parallel, the number of inductors connected in parallel is reduced when second inductor 28a (inductor L2) including the fuse wire is disconnected by fusing. Hence, inductance L of inductor unit 6 increases, and the increase of inductance L causes the frequency band of the cutoff frequency (resonant frequency) in LC resonance circuit 4 to fluctuate to be low from f1 to f0. Accordingly the RF signal in fluctuated frequency band f0 of the cutoff frequency is blocked.

Thus, by setting capacitor unit 5 and inductor unit 6 such that the frequency band of the cutoff frequency in LC resonance circuit 4 after the disconnection of second inductor 28a (inductor L2) including a fuse wire by fusing fluctuates within prescribed frequency band f0, RF signal blocking device 1 is provided which involves a new configuration having a function capable of reliably blocking an RF signal in prescribed frequency band f0 after an abnormality of fusing in second inductor 28a (inductor L2) including a fuse wire occurs due to an input of an RF signal having an RF power value greater than or equal to a predetermined level.

Further, the ferrite (magnetic body) of magnetic layer exhibits a large loss in a high-frequency band, and an RF signal inputted to second inductor 28a is lost as heat by ferrite. Thus, ferrite arranged close to second inductor 28a generates heat to effectively heat the wiring pattern of second inductor 28a in the case where an RF signal having an RF power value greater than or equal to a predetermined level is inputted to second inductor 28a, so that second inductor 28a is fused efficiently.

Further, LC resonance circuit 4 including capacitor unit 5 and inductor unit 6 connected in parallel has a characteristic that the impedance becomes maximum at resonant frequency f. Thus, by connecting input terminal PI to one connection point of the parallel circuit including capacitor unit 5 and inductor unit 6 connected in parallel and connecting output terminal PO to the other connection point, inductor L2 including second inductor 28a is disconnected by fusing when an RF signal having an RF power value greater than or equal to a predetermined level is inputted to LC resonance circuit 4, and the cutoff frequency of LC resonance circuit 4 fluctuates within prescribed frequency band f0. After that, the RF signal in prescribed frequency band f0 inputted to input terminal PI is reflected by LC resonance circuit 4, and therefore, the RF signal in prescribed frequency band f0 is reliably blocked.

Further, by configuring LC resonance circuit 4 to be a chip component, RF signal blocking device 1 is compact, so that RF signal blocking device 1 is easily and readily mounted to a wiring substrate or the like.

Second Preferred Embodiment

Figure 5A:
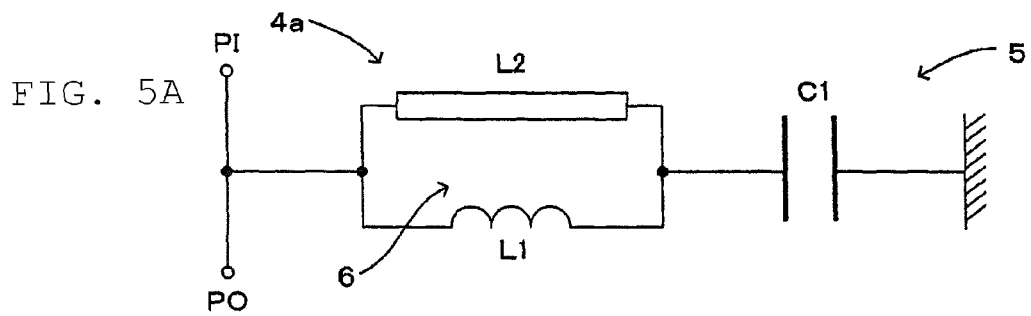
Figure 5B:
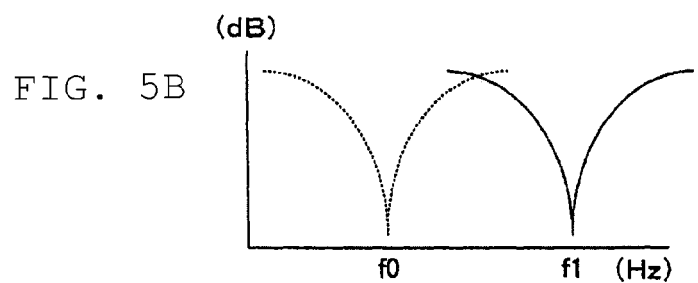
Figure 6A:
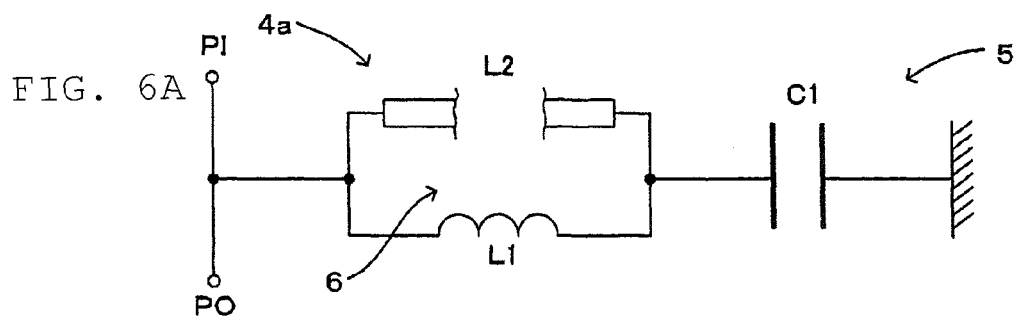
Figure 6B:
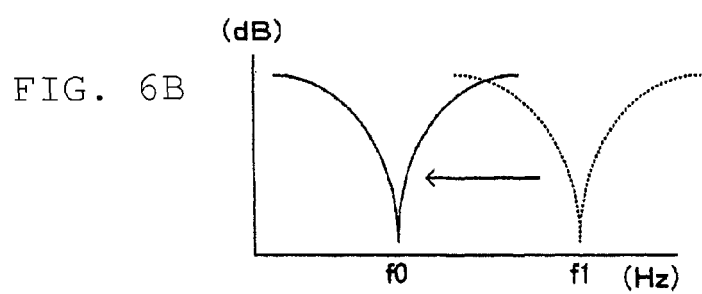
Figure 7:
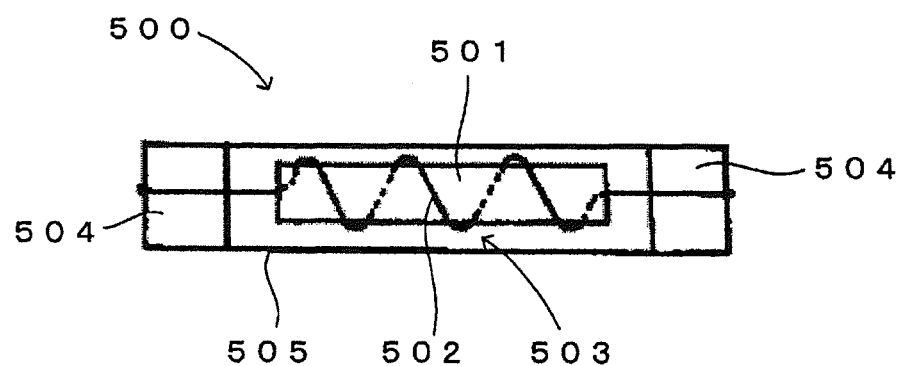
FIG. 7 represents one example of a conventional coil with a fuse function.

A second preferred embodiment of the RF signal blocking device according to the present invention will be described with reference to FIGS. 5A, 5B, 6A and 6B. FIGS. 5A, 5B, 6A and 6B are diagrams illustrating the RF signal blocking device of the second preferred embodiment according to the present invention, where FIGS. 5A and 6A illustrate an equivalent circuit, and FIGS. 5B and 6B illustrate a frequency characteristic. FIGS. 5A and 5B represent a normal state of the RF signal blocking device, and FIGS. 6A and 6B represent a state where an abnormality has occurred in the RF signal blocking device.

The second preferred embodiment is different from the first preferred embodiment in that, as shown in FIG. 5A, capacitor unit 5 and inductor unit 6 are connected in series to define an LC resonance circuit 4a. Input terminal PI and output terminal PO are connected to one open end of the series circuit including capacitor unit 5 and inductor unit 6 connected directly, and the other open end is grounded, so that the RF signal in frequency band f1 higher than prescribed frequency band f0 is blocked as shown in FIG. 5B. Other configuration features and operation are preferably the same as or similar to those of the first preferred embodiment. Therefore, description of the configuration and operation will be omitted by allotting the same reference numerals.

With such a configuration, LC resonance circuit 4a including capacitor unit 5 and inductor unit 6 connected in series has a characteristic that impedance becomes minimum at the resonant frequency. Thus, by connecting input terminal PI and output terminal PO to one open end of capacitor unit 5 and inductor unit 6 connected in series and grounding the other connection point, second inductor 28a (inductor L2) including a fuse wire is disconnected by fusing as shown in FIG. 6A, when an RF signal having an RF power value greater than or equal to the predetermined level is inputted to LC resonance circuit 4a. After the cutoff frequency of LC resonance circuit 4a fluctuates within the prescribed frequency band f0 as shown in FIG. 6B, the RF signal in prescribed frequency band f0 inputted to input terminal PI flows to the ground through LC resonance circuit 4a. Therefore, the RF signal in prescribed frequency band f0 is reliably blocked.

Further, since an RF signal having an RF power value greater than or equal to the predetermined level flows to the ground through LC resonator 4a, damage to other circuit elements due to the RF signal is prevented.

The present invention is not limited to the preferred embodiments described above, and various modifications other than those described above can be applied as long as the modification does not depart from the spirit of the present invention. For example, the number of capacitors defining the capacitor unit 5 and the number of inductors connected in parallel to define inductor unit 6 are not limited to the examples described above. For example, the number of capacitors and the number of inductors may be set as needed depending on a circuit configuration of the external device to which the RF signal blocking device is provided.

Further, although magnet layer 28 provided with second inductor 28a preferably includes ferrite in the preferred embodiments described above, an insulator layer provided with second inductor 28a by a normal ceramic dielectric may be provided. Further, the configuration of arranging ferrite (magnetic body) close to inductor L2 is not limited to the example described above. Ferrite may be arranged close to inductor L2 in any form, for example, by arranging ferrite partially in contact with a central portion of second inductor 28a of inductor L2, as long as second inductor 28a is capable of being heated by ferrite generating heat due to loss of the RF signal.

Further, the configuration of the RF signal blocking device is not limited to a chip component. For example, any configuration of the RF signal blocking device may be adopted, for example, by providing the RF signal blocking device with an internal wiring pattern of a resin multilayer substrate to which a plurality of circuit elements are mounted.

Further, the inductor (wiring) pattern of the inductor may be a lumped constant line such as a coil or a distributed constant line such as a strip line.

Preferred embodiments of the present invention can be applied to various devices that use an RF signal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An RF signal blocking device for blocking a portion of an RF signal inputted therein in a prescribed frequency band if an RF power value of the RF signal is greater than or equal to a predetermined level, the RF signal blocking device comprising:

an LC resonance circuit including a capacitor unit that includes at least one capacitor and an inductor unit that includes a first inductor and a second inductor connected in parallel, and having a resonant frequency higher than the prescribed frequency band; wherein the second inductor includes a fuse wire which is disconnected as a result of the RF signal having the RF power value greater than or equal to the predetermined level being inputted therein, and the resonant frequency of the LC resonance circuit after disconnecting the fuse wire of the second inductor being set in the prescribed frequency band.

2. The RF signal blocking device according to claim 1, wherein at least one of the first inductor and the second inductor includes a lumped constant line or a distributed constant line.

3. The RF signal blocking device according to claim 1, further comprising a magnetic body arranged close to the fuse wire.

4. The RF signal blocking device according to claim 1, wherein the capacitor unit and the inductor unit define a parallel circuit; and the RF signal blocking device includes:

an input terminal connected to a first connection point of the parallel circuit and an output terminal connected to a second connection point of the parallel circuit.

5. The RF signal blocking device according to claim 1, wherein the capacitor unit and the inductor unit define a series circuit; and the RF signal blocking device includes:

an input terminal and an output terminal connected to a first open end of the series circuit, and a second open end of the series circuit is grounded.

6. The RF signal blocking device according to claim 1, wherein the LC resonance circuit is a chip component.

7. The RF signal blocking device according to claim 1, wherein the RF signal blocking device is a chip component.

8. A mobile communication terminal comprising the RF signal blocking device according to claim 1.

9. The mobile communication terminal according to claim 8, further comprising:

an antenna;

a power amplifier that amplifies the RF signal;

a coupler connected to the antenna and arranged such that the RF signal blocking device is located between the coupler and an output of the power amplifier.

10. The RF signal blocking device according to claim 1, further comprising a multilayer substrate including the LC resonance circuit.

11. The RF signal blocking device according to claim 10, wherein the multilayer substrate includes dielectric ceramic layers and magnetic ceramic layers.

12. The RF signal blocking device according to claim 11, wherein the second inductor is located on one of the dielectric ceramic layers.

13. The RF signal blocking device according to claim 11, wherein the second inductor is located on one of the magnetic ceramic layers.

14. The RF signal blocking device according to claim 10, wherein the multilayer substrate includes insulator layers and magnetic layers.

15. The RF signal blocking device according to claim 14, wherein the second inductor is located on one of the insulator layers.

16. The RF signal blocking device according to claim 14, wherein the second inductor is located on one of the magnetic layers.

* * * * *